(12) United States Patent
Iriarte et al.

(10) Patent No.: US 8,330,505 B2
(45) Date of Patent: Dec. 11, 2012

(54) PROTECTION CIRCUIT FOR DRIVING CAPACITIVE LOADS

(75) Inventors: Santiago Iriarte, Valencia (ES); Alberto Marinas, El Puig (ES); Colm Donovan, Valencia (ES); Eduardo Martinez, Valencia (ES)

(73) Assignee: Analog Devices, Inc., Norwood, MA (US)

( * ) Notice: Subject to any disclaimer, the term of this patent is extended or adjusted under 35 U.S.C. 154(b) by 82 days.

(21) Appl. No.: 13/076,814

(22) Filed: Mar. 31, 2011

(65) Prior Publication Data

US 2012/0249185 A1     Oct. 4, 2012

(51) Int. Cl.
*H03K 3/00* (2006.01)
(52) U.S. Cl. ......................... 327/111; 327/109
(58) Field of Classification Search .................. 361/78, 361/79, 86, 88, 90, 90.1
See application file for complete search history.

(56) References Cited

U.S. PATENT DOCUMENTS

| | | | |
|---|---|---|---|
| 5,432,665 A | 7/1995 | Hopkins | |
| 6,118,293 A * | 9/2000 | Manhaeve et al. | 324/750.3 |
| 6,130,541 A | 10/2000 | Ozguc | |
| 6,703,848 B2 | 3/2004 | Cho | |
| 2011/0050255 A1 | 3/2011 | Iriarte et al. | |

OTHER PUBLICATIONS

PCT International Search Report for PCT/US12/026852 mailed on Jun. 25, 2012.

* cited by examiner

*Primary Examiner* — An Luu
(74) *Attorney, Agent, or Firm* — Kenyon & Kenyon LLP (57) ABSTRACT

A detection circuit is coupled to an output terminal of a driver circuit. The detection circuit includes a comparator to compare a signal at the output terminal to a reference signal corresponding to a signal that would be generated if a capacitive load having a relatively high capacitance value were connected to the output terminal. Output of the comparator is sampled at a predetermined time after the driver circuit provides the drive signal. An error signal is generated when the sampled output indicates that the capacitive load having the relatively high capacitance value is actually connected to the output terminal.

22 Claims, 9 Drawing Sheets

PROTECTION CIRCUIT FOR DRIVING CAPACITIVE LOADS

FIELD OF THE INVENTION

The present invention relates to driver protection circuits that prevent short circuits and high currents that could potentially damage the driver. The present invention also relates to methods for protecting the circuits that drive capacitive loads.

BACKGROUND OF INVENTION

Capacitive loads are often found in the form of piezoelectric actuators, such as piezoelectric speakers or motors for driving mechanical components. Typically, the capacitive loads are relatively small, e.g., on the order of 2 nF. Thus, driver circuits for driving capacitive loads are often designed without taking into account the possibility that the drivers may be connected to loads that are of greater capacitance than the drivers can handle. As the load capacitance increases, so does the power required to drive the capacitance. If the power exceeds the current handling capabilities of the driver, damage may occur.

Figure 1:
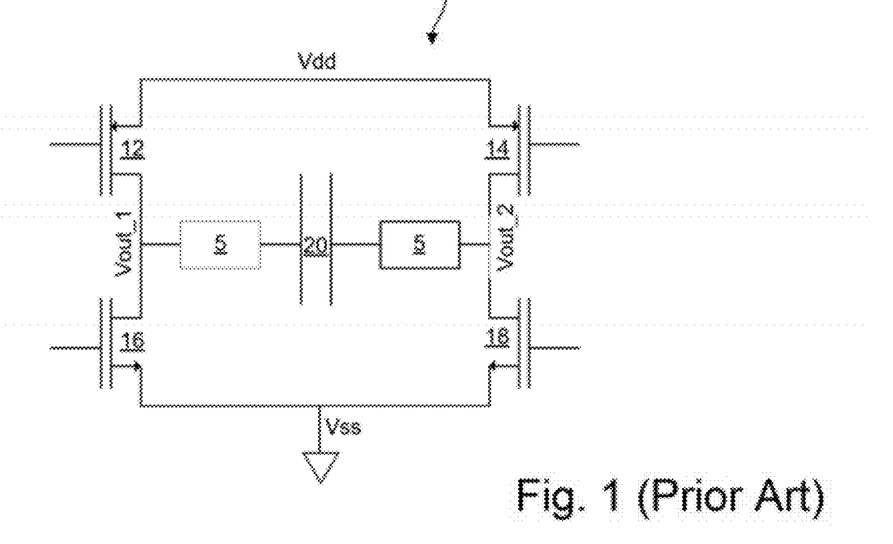
FIG. 1 is a diagram of a conventional H-bridge driver.

FIG. 1 shows an example of a conventional H-bridge driver 10 formed using CMOS elements. Each terminal of a capacitive load 20 is connected to a respective resistor 5, which receives an input signal from a source-drain connection of a PFET-NFET transistor pair. Alternatively, the capacitor terminals may be connected directly to the source-drain connection without intervening resistors. One transistor pair consists of a PFET 12 and an NFET 16. Another pair consists of a PFET 14 and an NFET 18. The PFETs 12/14 operate as pull-up devices and are connected to a power supply signal Vdd. The NFETs operate as pull-down devices and are connected to a ground signal Vss. Depending on the gate inputs supplied to the transistors 12/14/16/18, the load 20 may be driven in any number of ways. For example, the PFET 12 may be switched on in combination with the NFET 16, e.g., by first turning the PFET 12 on to develop a voltage (e.g., Vdd) at a source-drain connection Vout_1, then turning PFET 12 off while turning NFET 16 on to provide a current path to Vss. Alternatively, the PFET 14 may be switched on in combination with the NFET 18, e.g., by turning the PFET 14 on, then off while turning NFET 18 on. In either of these configurations, current is supplied across the terminals of the load 20. If the capacitance of the load 20 is too large, the current may exceed the handling capabilities of the driver 10, and cause permanent damage to one or more of the transistors 12/14/16/18.

In addition to high capacitance, another problem to which the present invention is directed is short circuits. In FIG. 1, if the PFET 12 and the NFET 18 are switched on while the terminals of the capacitor are shorted, this leads to a dangerous condition in which Vdd is essentially connected directly to Vss through low ohmic drivers. Consequently, a large current develops through the transistors 12/18 which, as pointed out above, can lead to permanent damage. Thus, there is a need in the art for techniques that prevent damage to drivers, and in particular, damage arising from attempts to drive high capacitive loads.

Figure 2:
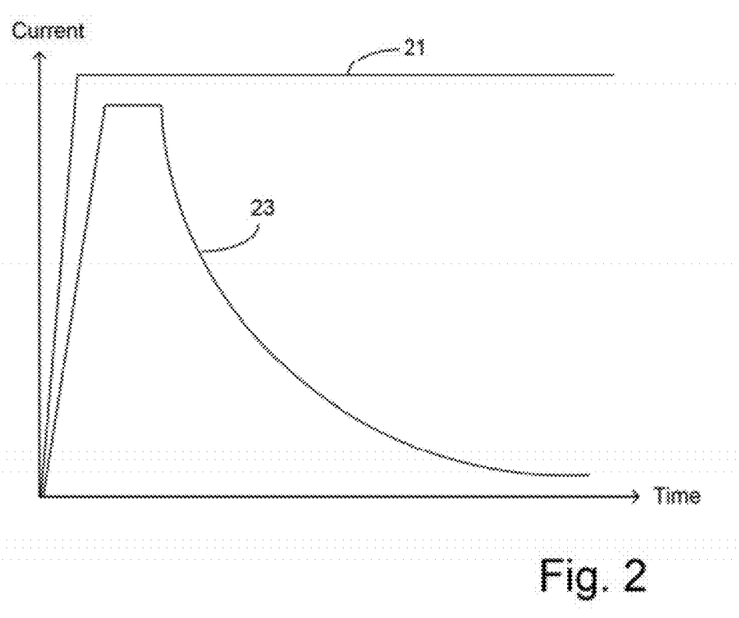
FIG. 2 is a diagram illustrating an output current of the driver of FIG. 1 as a function of time.

FIG. 2 shows a plot of the output current of the driver 10 of FIG. 1 versus time. A curve 23 may correspond to a hypothetical current measured through either of the two source-drain connections labeled Vout_1 and Vout_2 in FIG. 1. A curve 21 may correspond to a hypothetical short circuit condition in which the current at the source-drain connection rapidly rises to a maximum and then remains constant. Curve 23 may be related to capacitor charge in that the current rapidly rises as the load 20 is charged, then saturates before slowly decreasing (corresponding to a transition from transistor saturation to triode region operation when the capacitor voltage is charged to a nearly Vdd-level voltage, as measured at Vout_1 or Vout_2).

As evident from the curves 21 and 23, the current goes high and saturates in both cases, so that it is not possible to distinguish the short circuit condition simply by detecting a high current. However, as explained below, selection of appropriate threshold detection levels in combination with detection timing allows for proper short circuit detection.

Additionally, the rate at which the current in curve 23 decays is a function of capacitor size and of the total series resistance connected to the capacitor (e.g., FET resistances plus any additional series resistances). If the load 20 is relatively small, then the current should decay quickly. Thus, as explained in connection with the exemplary embodiments of the present invention, current and/or voltage at the output, e.g., the source-drain connection Vout_1, can be used to detect capacitor size.

DETAILED DESCRIPTION

Embodiments of the present invention provide methods for enhanced driver protection. The methods may involve comparing an output signal of a driver circuit that drives a capacitive load to a reference voltage, then sampling a result of the comparison at a predetermined time after the output signal is asserted. The reference voltage may be associated with an error condition such as a high capacitive load or a short circuit. The methods may also involve generating an error signal when the sampled result indicates that the output signal is below the reference voltage. By detecting the error condition at an appropriate time using the voltage comparison, the methods of the present invention provide for a more robust protection of the driver circuit compared to conventional protection schemes.

Figure 3:
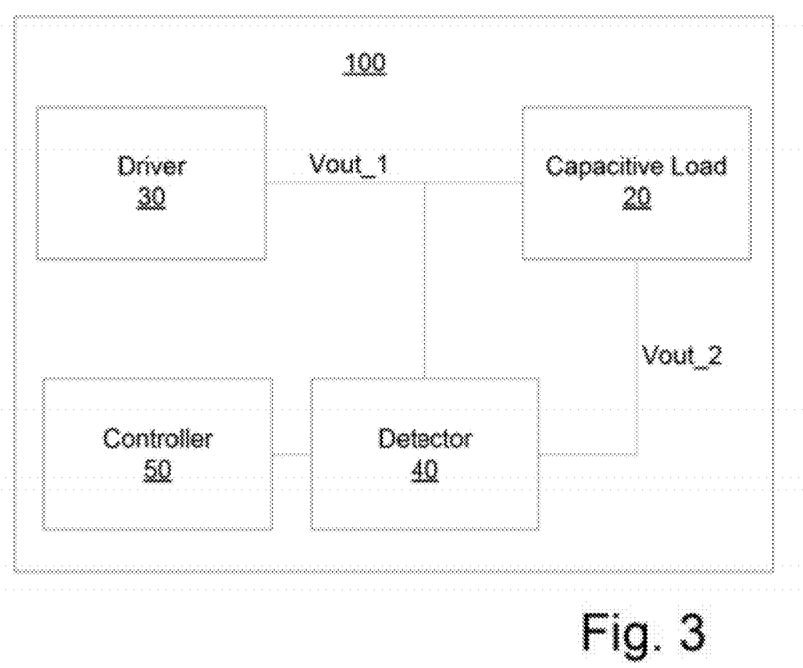
FIG. 3 is a block diagram illustrating a system for driver protection according to an embodiment of the present invention.

FIG. 3 shows an exemplary system 100 according to the present invention. The system 100 includes a capacitive load (e.g., the load 20), a driver 30, a detector 40 and a controller 50.

The driver 30 may be any driver of a capacitive load, such as the driver 10 previously described. The driver 30 may produce the output signal over Vout_1 in response to some input, e.g., from the controller 50, to drive the load 20. Although the driver 30 is a CMOS circuit, other types of circuit technologies may be used to form suitable drivers. For example, in an alternative embodiment, the driver 30 may include bi-polar junction transistors (BJTs), in which case the output voltage/current can be measured as a function of a signal across the base and emitter terminals of a BJT.

Figure 4:
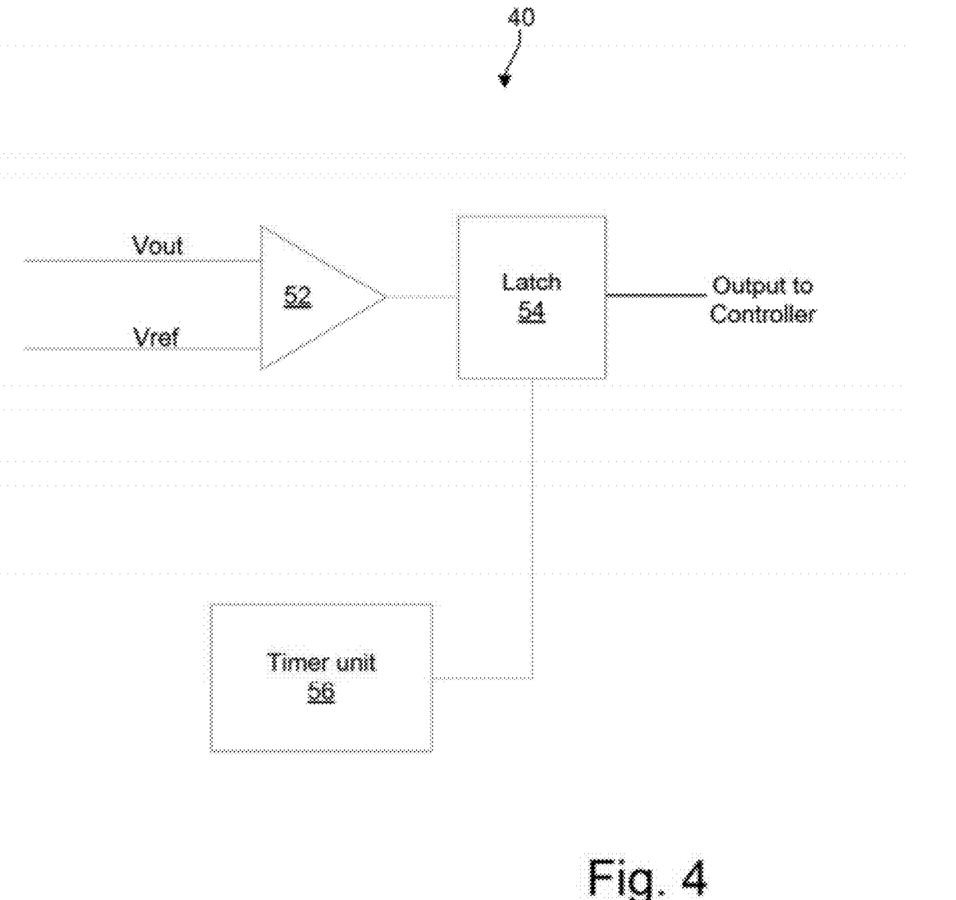
FIG. 4 is a block diagram illustrating components of a detection circuit according to an embodiment of the present invention.

Referring to FIG. 4, the detector 40 is shown to include a comparator 52, a latch 54 and a timer unit 56. The comparator 52 may receive the signal Vout as an input along with a reference signal Vref. In an exemplary embodiment, Vout is connected to Vout_1 of FIG. 3. The comparator 52 may compare Vout to Vref and generate a digital output, e.g., a "1" if Vout is greater than Vref and a "0" if Vout is not greater than Vref. In alternative embodiments, the comparator 52 may generate an analog output. However, for ease of implementation, it is preferred that the output is digital. Vref may be a selectable reference voltage corresponding to Vthres_1 and/or Vthres_2 (described below in connection with FIG. 6). For example, Vref may be set to Vthres_1 at T1, then changed to Vthres_2 at T2. Alternatively, a separate comparator may be provided so that Vref can be fixed at either Vthres_1 or Vthres_2.

The latch 54 may receive the digital output of the comparator 52 and latch the digital output at times determined by the timer unit 56. The latch 54 may be any device capable of storing an input signal in response to a control signal. The latch 54 may pass the digital output to the controller 50. In one embodiment, the latch 54 may be a flip-flop that receives the control signal as an enable input so that the digital output is latched each time the control signal is asserted.

The timer unit 56 may generate the control signal as a delayed response to an assertion of Vout by the driver 30, e.g., in response to the assertion of a gate input that causes the driver 30 to produce Vout. The control signal can be output any number of times in response to each assertion of Vout. In one embodiment, each assertion results in the control signal being output at a predetermined time corresponding to a delay equal to T1. In another embodiment, each assertion results in the control signal being output at T1, then output again at T2. The number and timing of each control signal output by the timer unit 56 depends on the requirements of a particular detection scheme which, as discussed below, can vary. The delay value(s) can be stored in the timer unit using any form of data storage, e.g., a temporary register.

The controller 50 may provide an input signal to the driver 30. The controller 50 may also modify the input signal when the detector 40 indicates the presence of an error condition. For example, the controller 50 may simply refrain from asserting the input signal to the driver 30 (thereby preventing generation of Vout) whenever the error condition is detected.

Although the exemplary embodiments of the present invention are described with respect to a Vout connected to the source-drain connection Vout_1, it will be understood that the present invention may also be implemented at other output nodes, e.g., the source-drain connection of the transistors 14/18 (Vout_2). This may be done in combination with, or as an alternative to, detection at Vout_1, so that both sides of the driver 10 are monitored during the respective on times of Vout_1 and Vout_2. For example, in an alternative embodiment, instead of feeding only Vout_1 into the comparator 52, Vout_1 and Vout_2 may be fed into the comparator 52 at different times using pass gates, the timing of which may be controlled by the timer unit 56. In yet another embodiment, the comparator 52 and the latch 54 may be duplicated to provide a parallel path for Vout_2, so that Vout_1 and Vout_2 are simultaneously compared to Vref and latched.

Figure 5:
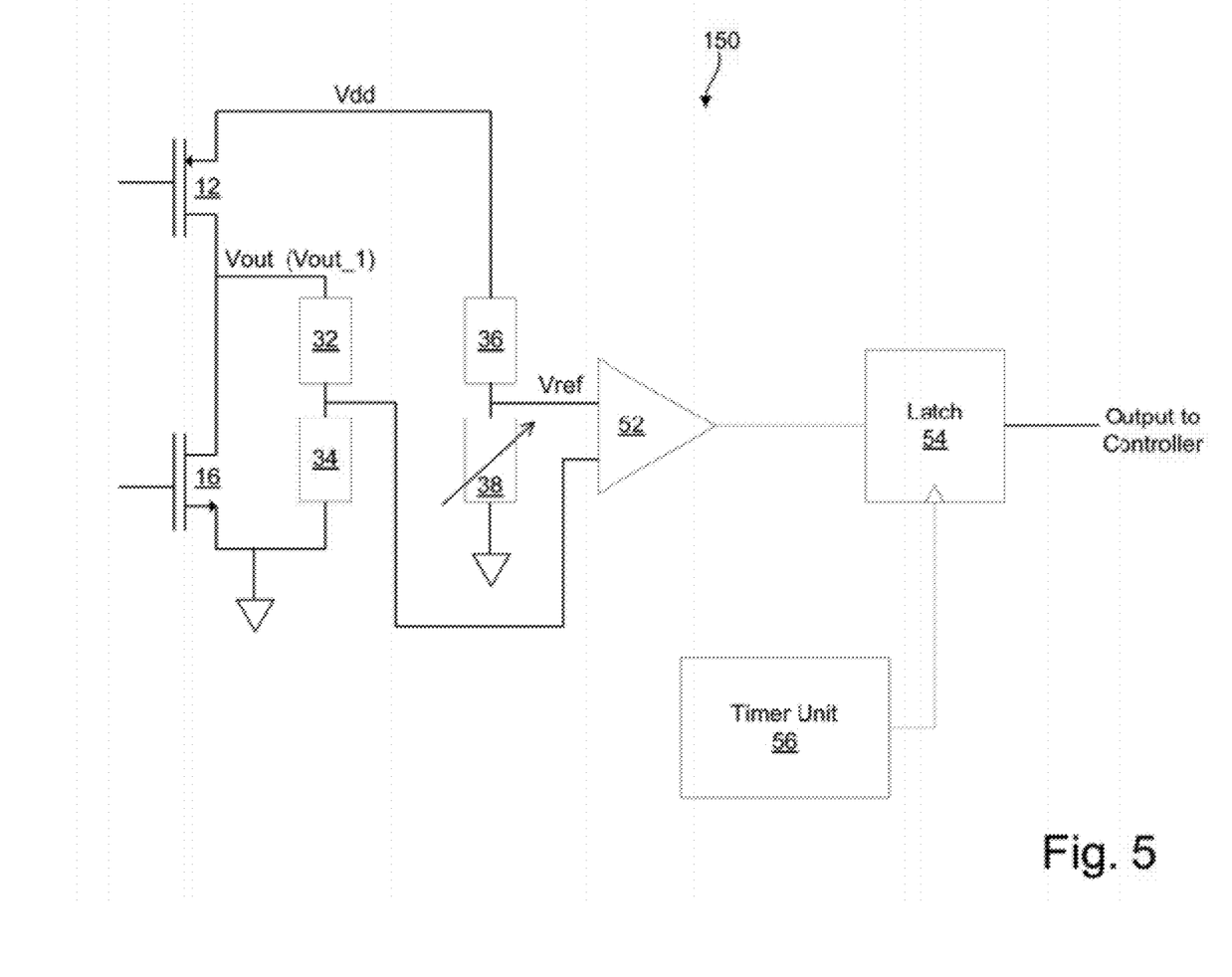
FIG. 5 is diagram illustrating an example of a detection circuit connected to a driver according to an embodiment of the present invention.

FIG. 5 shows a system 150 according to an embodiment of the present invention, in which the detector 40 is connected to the driver 10 shown in FIG. 1. For illustrative purposes, only the PFET 12 and the NFET 16 are shown. Instead of connecting the comparator 52 directly to Vout as shown in FIG. 4, a resistor divider comprising series resistors 32 and 34 may be used to lower Vout before input into the comparator 52. Additionally, a second resistor divider comprising series resistors 36 and 38 may be used to lower Vdd before input into the comparator 52. The resistance values of the resistors 32/34/36/38 may be selected to provide voltage levels appropriate for use with the comparator 52.

The resistor 38 may be a variable resistor set to a value that causes Vref to equal Vthres_1 or Vthres_2. In this manner, the comparator 52 can be configured to compare Vout (or, in the example of FIG. 5, a signal derived from Vout) to Vthres_1 or Vthres_2.

Figure 6:
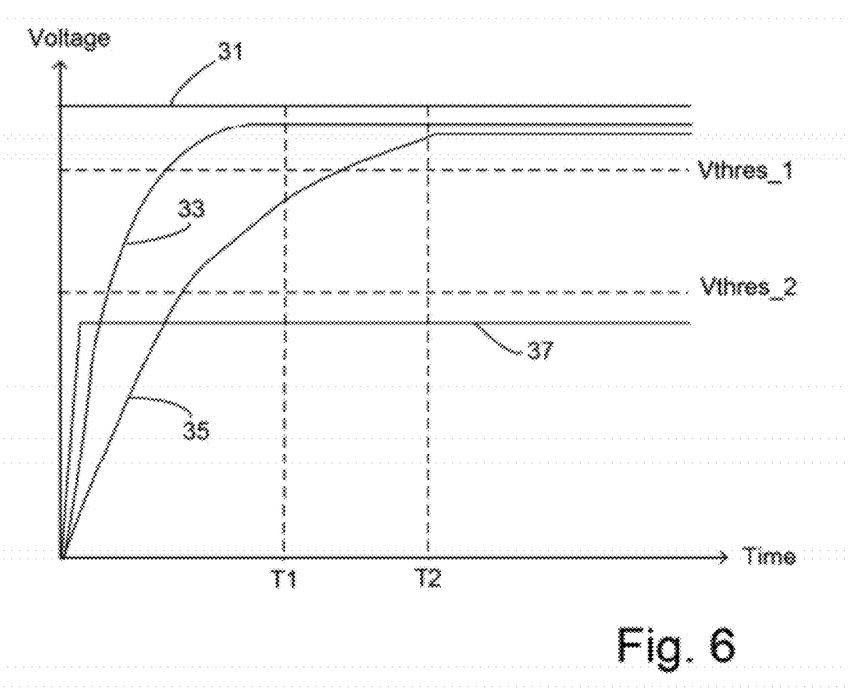
FIG. 6 is a diagram illustrating exemplary detection principles of the present invention as applied to output voltage versus time.

FIG. 6 shows a plot of the output voltage at the source-drain connection Vout_1 when the PFET 12 is turned on. A substantially constant voltage level 31 corresponds to a voltage at the source terminal of the PFETs 12/14. The voltage 31 may be equal to Vdd or, alternatively, may be a boosted voltage greater than Vdd. A curve 33 corresponds to a voltage characteristic of a small capacitor, while a curve 35 corresponds to a voltage characteristic of a large capacitor. A curve 37 corresponds to a voltage level associated with a short circuit, i.e., a short to Vss. The curves shown in FIG. 6 may be equally representative of the output voltage at Vout_2 when the PFET 14 is turned on.

As shown in FIG. 6, the small capacitor reaches a saturation voltage faster than the large capacitor. This can be used as a basis for distinguishing small capacitances from large capacitances. For example, a threshold voltage detection may be performed at a time in which the small capacitor is expected to be at or near saturation (T1), but the large capacitor has not yet reached saturation. Additionally, a threshold voltage detection may be performed at a time in which both the small capacitor and the large capacitor are expected to be at or near saturation (T2), making it possible to detect whether there is a short circuit, since the short circuit voltage is substantially lower than the saturation voltage of either capacitor.

Also shown in FIG. 6 are threshold voltages Vthres_1 and Vthres_2, which may be selected in combination with detection times, e.g., T1 and T2, to define an exact set of conditions that must be met in order to determine that neither a short circuit nor an excessively large capacitance is present. Vthres_1 may correspond to a voltage level less than the saturation voltage of the small capacitance, yet greater than the expected voltage of the large capacitor at T1. Thus, if a voltage detected at T1 exceeds Vthres_1, this indicates that the capacitor is a small capacitor. However, if the detected voltage does not exceed Vthres_1, then either the capacitor is large or there exists a short circuit.

Vthres_2 may correspond to a voltage level less than the saturation voltages of the large capacitor and the small capacitor, yet greater than the short circuit voltage. Thus, if a voltage detected at T2 exceeds Vthres_2, this indicates that the capacitor is either a small capacitor or a large capacitor. However, if the detected voltage does not exceed Vthres_2, then there exists a short circuit.

Figure 7:
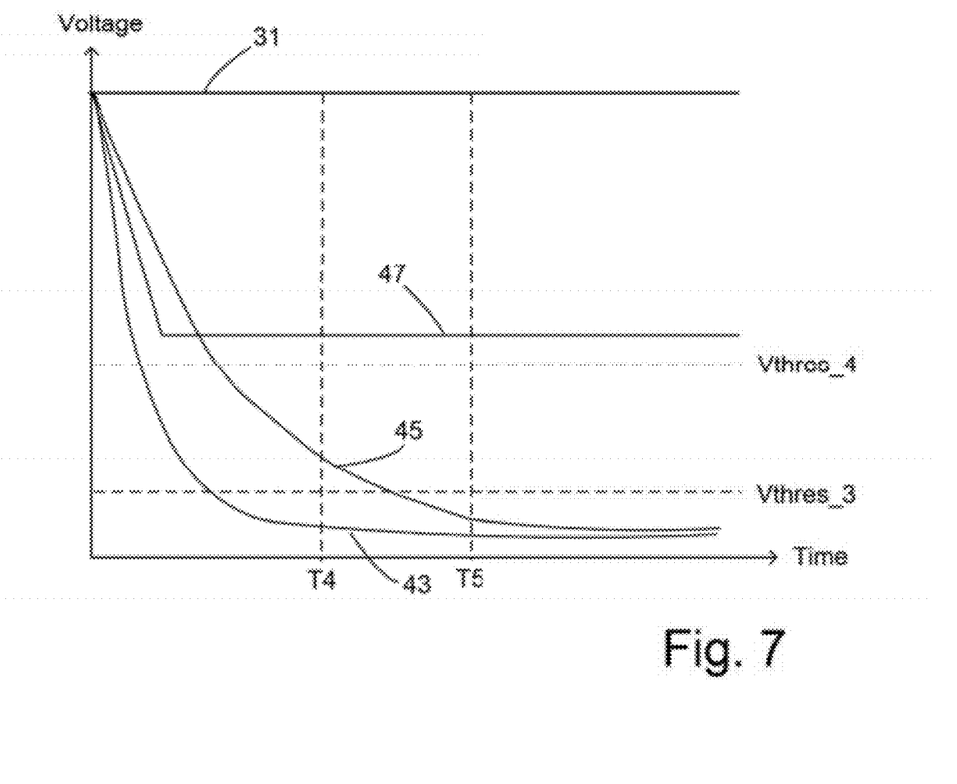
FIG. 7 is a diagram illustrating additional exemplary detection principles of the present invention as applied to output voltage versus time.

FIG. 7 shows a plot of the output voltage at the source-drain connection Vout_1 when the NFET 16 is turned on. The substantially constant voltage level 31, as discussed above in connection with FIG. 6, may correspond to Vdd or a boosted supply voltage. A curve 43 corresponds to a voltage characteristic of a small capacitor, while a curve 45 corresponds to a voltage characteristic of a large capacitor. A curve 47 corresponds to a voltage level associated with a short circuit, i.e., a short to Vdd. The curves shown in FIG. 7 may be equally representative of the output voltage at Vout_2 when the NFET 18 is turned on.

Also shown in FIG. 7 are threshold voltages Vthres_3 and Vthres_4, which may be selected in combination with detection times, e.g., T4 and T5, to define an exact set of conditions that must be met in order to determine that neither a short circuit nor an excessively large capacitance is present. Vthres_3 may correspond to a voltage level greater than the saturation voltage of the small capacitance, yet smaller than the expected voltage of the large capacitor at T4. Thus, if a voltage detected at T4 is less than Vthres_3, this indicates that the capacitor is a small capacitor. However, if the detected voltage exceeds Vthres_3, then either the capacitor is large or there exists a short circuit.

Vthres_4 may correspond to a voltage level greater than the saturation voltages of the large capacitor and the small capacitor, yet less than the short circuit voltage. Thus, if a voltage detected at T5 is less than Vthres_4, this indicates that the capacitor is either a small capacitor or a large capacitor. However, if the detected voltage exceeds Vthres_4, then there exists a short circuit.

Exemplary detection methods will now be described in connection with FIGS. 8 to 10. The detection methods may be implemented using the systems and devices previously described, and may be performed at any time. For example, it is possible to perform any of the methods during a testing phase of device manufacture, in order to detect large capacitances or short circuits prior to device packaging. In a preferred embodiment, at least one of the methods is performed on a continuous basis while the driver 30 is in operation. Accordingly, the timer unit 56 can be implemented as a digital clock that is enabled or reset whenever there is a new assertion of Vout.

Figure 8:
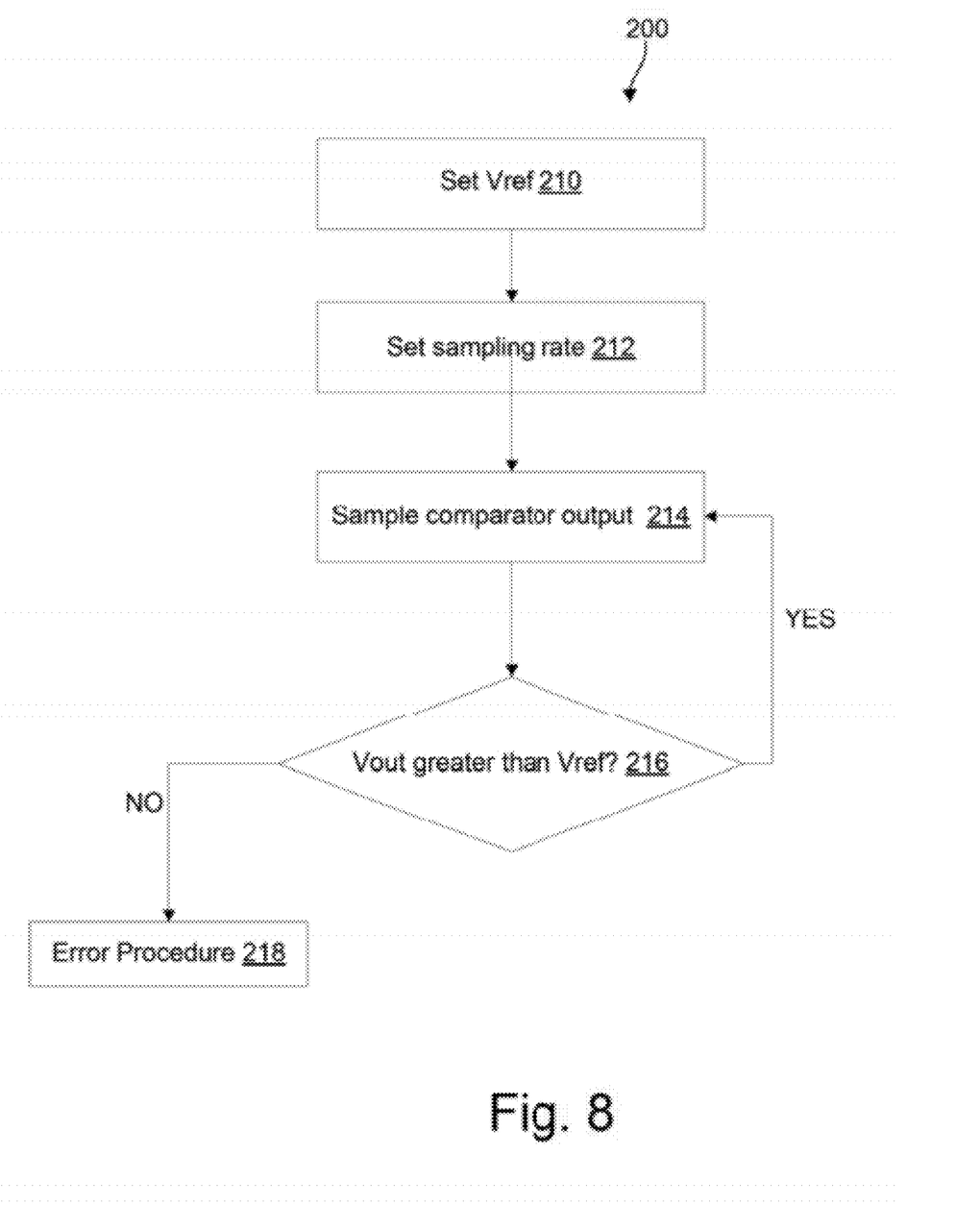
FIG. 8 is a flow chart illustrating a first detection method according to an embodiment of the present invention.

FIG. 8 shows an exemplary method 200. In step 210, Vref is set. Vref may correspond to either Vthres_1, or Vthres_2, depending on the detection requirements of a user. For example, if the user is interested in detecting both large capacitances and short circuits, Vref can be set to Vthres_1. However, if the user is only concerned with short circuits, Vref can be set to Vthres_2.

In step 212, the sampling rate may be set. The sampling rate may correspond to a delay value programmed into the timer unit 56. The delay value may cause sampling to occur in sync with an activation of the transistors. For example, if Vthres_1 or Vthres_2 are used, then the sampling may occur when PFET 12 or 14 is turned on.

In step 214, the output of the comparator 52 may be sampled by the latch 54 after a delay equal to the sampling rate.

In step 216, the method 200 may determine, based on the comparator output, whether Vout is greater than Vref. This determination may be performed anytime after the latching in step 214. In one embodiment, the controller 50 may be configured to periodically poll the latch 54 to perform the determination. If Vout exceeds Vref, then there is no error condition and the method 200 returns to 214. However if Vout does not exceed Vref, then an error condition is present and an error procedure is executed in 218.

The error procedure in 218 may include preventing the driver 30 from driving the load 20. Additionally, an error indicator may be provided to the user in the form of a visual display, an audio alarm, an error log, etc.

Figure 9:
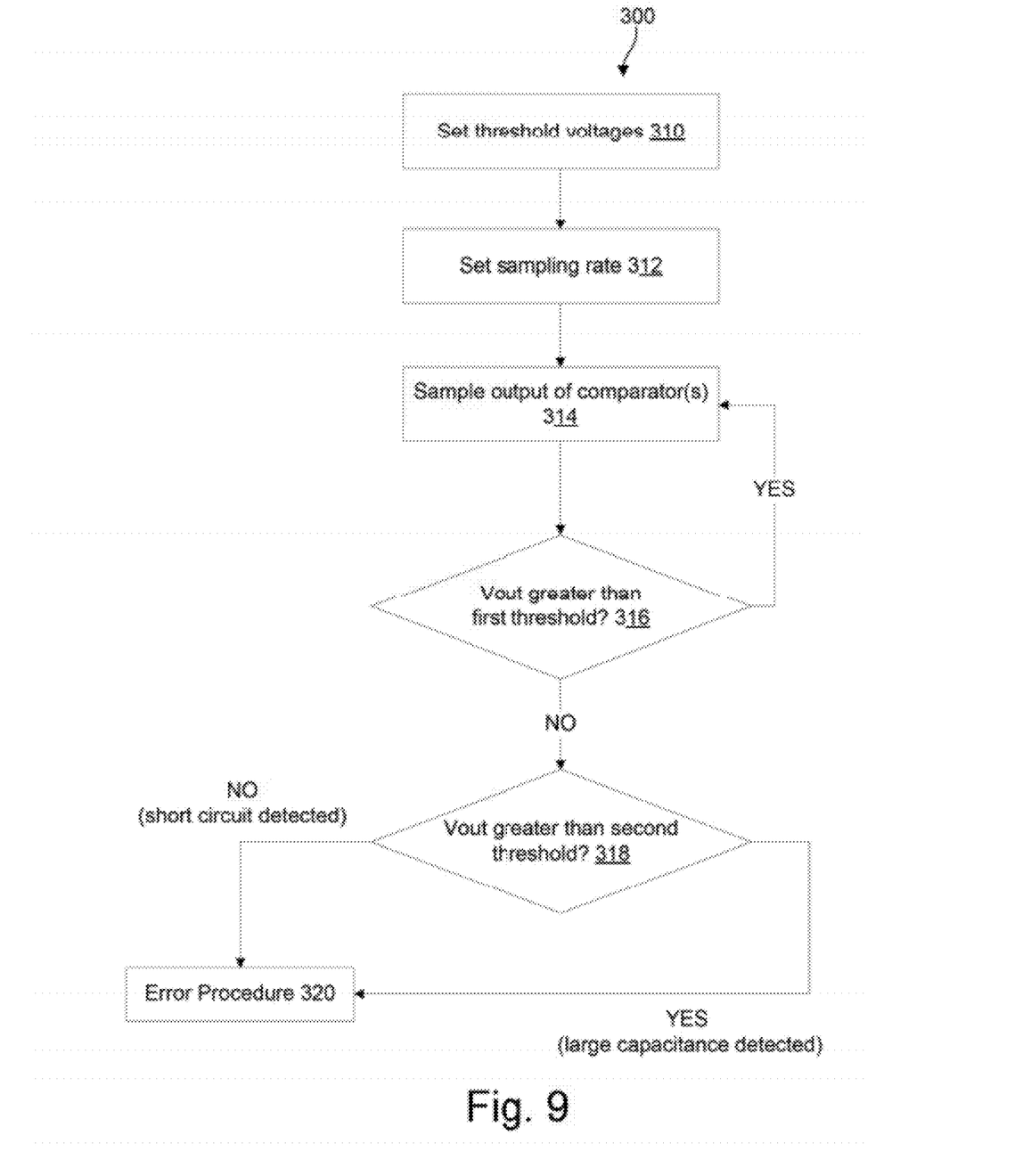
FIG. 9 is a flow chart illustrating a second detection method according to an embodiment of the present invention.

FIG. 9 shows an exemplary method 300, which differs from the method 200 in that a plurality of threshold voltages are set, instead of setting a single Vref (310). In step 312, the sampling rate may be set in a manner similar to that of step 212 in FIG. 8.

In step 314, the output of one or more comparators is sampled. In one embodiment, a separate comparator may be provided for each threshold voltage, e.g., one for Vthres_1 and one for Vthres_2. Each comparator can be operated in parallel. In another embodiment, a single comparator, e.g., the comparator 52 may, at different times, compare Vout to a respective threshold voltage, then output each comparison to a separate latch. For example, the timer unit 56 may control the resistor 38 so that Vref varies between Vthres_1 and Vthres_2. The timer unit 56 may also cause the separate latches to latch the output of the comparator 56 in conjunction with the varying of Vref, e.g., after appropriate delays.

In step 316, the method 300 may determine, based on the comparator output, whether Vout exceeds a first threshold, e.g., Vthres_1. If Vout exceeds Vthres_1, then there is no error and the method 300 returns to step 314.

If Vout does not exceed Vthres_1, then the method 300 proceeds to 316, where it may be determined whether Vout exceeds Vthres_2. If Vout exceeds Vthres_2, then a large capacitance is detected, but there is no short circuit. If Vout does not exceed Vthres_2, then there is a short circuit. In either case, an error procedure is performed in 320. The error procedure may be similar to that of step 218 in FIG. 8. Additionally, the error condition may be handled in different ways depending on the nature of the error. For example, short circuits may require immediate shut-down, whereas large capacitances may involve gradual shut-down or drive operation using a nominal output voltage that won't damage any circuit components.

Figure 10:
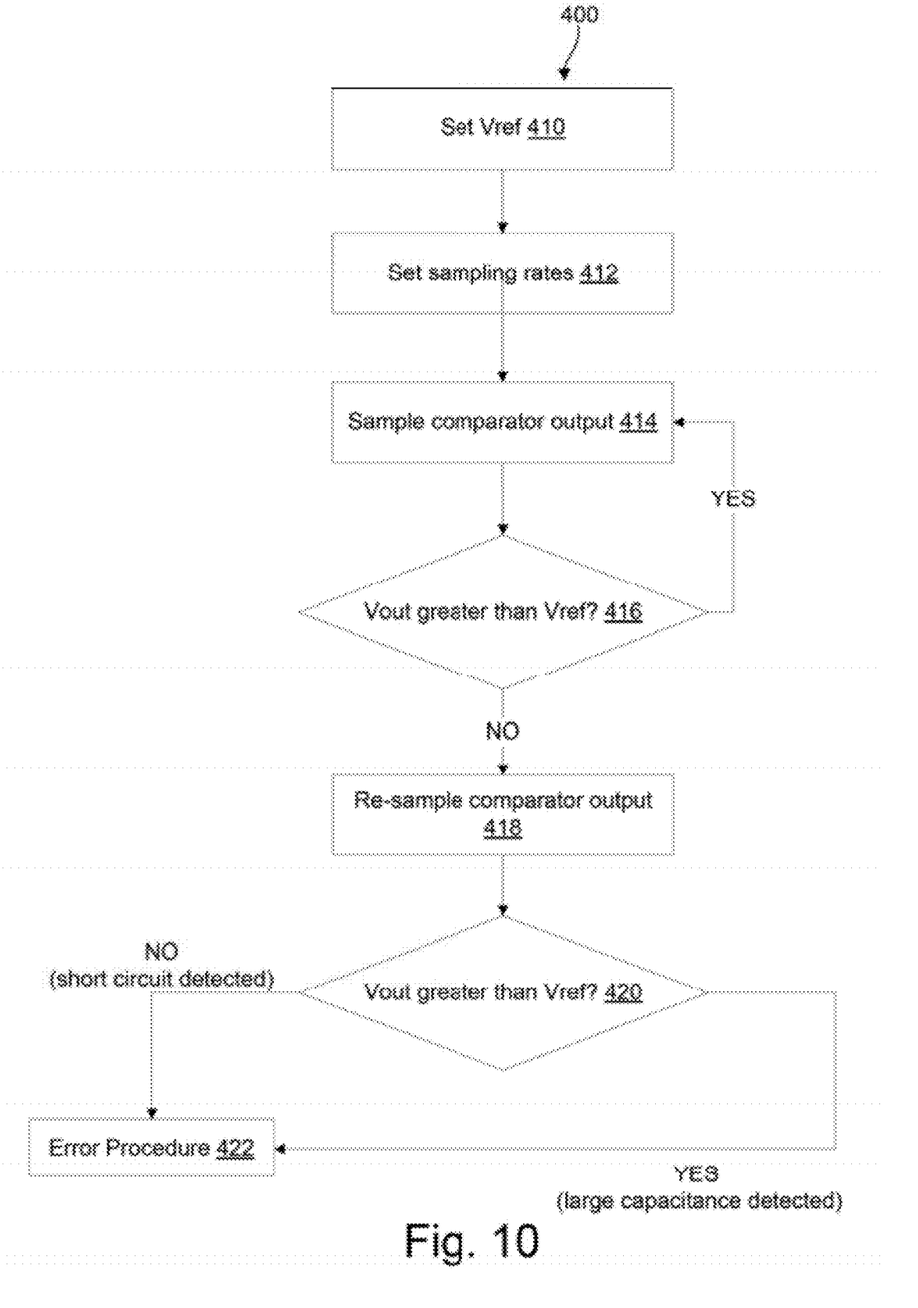
FIG. 10 is a flow chart illustrating a third detection method according to an embodiment of the present invention.

FIG. 10 shows an exemplary method 400, in which a single Vref value, e.g., Vthres_1, is set in step 410. In 412, a plurality of sampling rates may be set in order to perform at least two comparisons at different times.

In 414, the output of a comparator, e.g., the comparator 52, may be sampled in accordance with the earliest of the sampling rates, e.g., T1.

In 416, the method 400 may determine whether Vout exceeds Vref. If Vout exceeds Vref, then there is no error and the method 400 returns to step 414. However, if Vout does not exceed Vref, then the method 400 proceeds to step 418, where the comparator output may be re-sampled in accordance with the next earliest sampling rate, e.g., T2.

In 420, the method 400 may again determine whether Vout exceeds Vref. If Vout exceeds Vref, then a large capacitance is detected. However, if Vout does not exceed Vref, then a short circuit is detected. In either case, an error procedure may be performed in 422, in a manner similar to that of step 320 in FIG. 9.

As illustrated in the exemplary embodiments above, the present invention enables various error conditions to be detected through careful selection of signal threshold and timing parameters. Using at least one threshold-timing parameter pair (e.g., Vthres_1 and T1), it is possible to distinguish normal operation from, for example, a short circuit or a high capacitive load.

The exemplary systems and methods above were discussed in connection with voltage detection during PFET activiation, i.e., when either PFET 12 or 14 is turned on. However, systems and methods may also be implemented in connection with NFET activation, i.e., when either NFET 16 or 18 is turned on. For example, Vref may correspond to Vthres_3 or Vthres_4, and analogous comparisons of Vout to Vref may be performed to determine whether a large capacitance, a smaller capacitance, or a short circuit is occurring. For example, after setting the appropriate threshold (e.g., Vref or either of the first and the second thresholds in FIG. 9) to Vthres_3 or Vthresh_4, the comparisons at each of steps 216, 316, 318, 416 and 420 may be substituted with a comparison that determines whether Vout is less than the threshold. It may be advantageous to combine PFET-based detection with complementary NFET-based detection, because although both types of detection can be used to determine whether a large capacitance or a small capacitance exists, PFET-based detection may enable detection of shorts to Vss, whereas NFET-based detection may enable detection of shorts to Vdd. Thus, in one alternative embodiment, the system 100 may perform sampling and detection for PFET activation as well as NFET activation. Additionally, detection of large and small capacitances need only be performed for one of the types of activation, since PFET-based detection and NFET-based detection are equally capable of detecting these conditions.

Although the exemplary methods described above utilize voltage detection, it will be understood that the present invention may also be implemented using current detection, since voltage and current are essentially governed by the relationship P=VI, where P is power, V is voltage and I is current. Accordingly, in alternative embodiments, current values may be substituted for Vref, Vthres_1, Vthres_2, Vthres_3 or Vthres_4.

What is claimed is:

1. A system, comprising:
   a driver circuit to drive a capacitive load at an output terminal thereof;
   a detection circuit coupled to the output terminal, comprising:
      a comparator to compare a voltage at the output terminal to a reference voltage, wherein an output of the comparator is sampled at a predetermined time after assertion of a drive signal at the output terminal; and
      a controller to generate an error signal when the sampled output indicates that the output terminal voltage is below the reference voltage.

2. The system of claim 1, wherein the reference voltage is greater than a voltage level associated with a short circuit between the output signal and a ground source.

3. The system of claim 1, wherein the reference voltage is based on an output voltage of the driver circuit when a maximum allowable capacitive load is being driven.

4. The system of claim 3, wherein the predetermined time is after the maximum allowable capacitive load reaches a fully charged state.

5. The system of claim 1, wherein the predetermined time occurs before the drive signal is de-asserted.

6. The system of claim 1, wherein the detection circuit includes a register for storage of a programmable value that defines the predetermined time.

7. The system of claim 1, wherein the detection circuit further comprises:
   a latch coupled to an output of the comparator to perform the sampling; and
   a timer that enables the latch at the predetermined time.

8. The system of claim 1, further comprising a programmable voltage divider that generates the reference voltage from a supply voltage of the driver circuit.

9. The system of claim 1, wherein the driver circuit is a CMOS circuit including a pull-up PFET and a pull-down NFET, a drain terminal of the PFET providing the output signal and connected to a first terminal of the capacitive load.

10. The system of claim 9, wherein the comparator has a first input connected to the drain terminal of the PFET and a second input connected to the reference voltage.

11. A method, comprising:
    comparing an output signal of a driver circuit that drives a capacitive load to a reference voltage; and
    sampling a result of the comparison at a predetermined time after the output signal is asserted; and
    generating an error signal when the sampled result indicates that the output signal is below the reference voltage.

12. The method of claim 11, wherein the reference voltage is greater than a voltage level associated with a short circuit between the output signal and a ground source.

13. The method of claim 11, wherein the reference voltage is based on an output voltage of the driver circuit when a maximum allowable capacitive load is being driven.

14. The method of claim 13, wherein the predetermined time is after the maximum allowable capacitive load reaches a fully charged state.

15. The method of claim 11, wherein the predetermined time occurs before the drive signal is de-asserted.

16. The method of claim 11, further comprising:
    storing a programmable value that defines the predetermined time, in a register of the detection circuit.

17. The method of claim 11, further comprising:
    sampling an output of the comparator using a latch; and
    controlling the latch with a timer that enables the latch at the predetermined time.

18. The method of claim 11, further comprising:
    setting the reference voltage using a programmable voltage divider that generates the reference voltage from a supply voltage of the driver circuit.

19. The method of claim 11, wherein the driver circuit is a CMOS circuit including a pull-up PFET and a pull-down NFET, a drain terminal of the PFET providing the output signal and connected to a first terminal of the capacitive load.

20. The method of claim 19, wherein the comparator has a first input connected to the drain terminal of the PFET and a second input connected to the reference voltage.

21. A system, comprising:
    a driver circuit providing a drive signal at an output terminal;
    a detection circuit coupled to the output terminal, comprising:
       a comparator to compare a signal at the output terminal to a reference signal that corresponds to a signal that would be generated if a capacitive load having a relatively high capacitance value were connected to the output terminal, wherein an output of the comparator is sampled at a predetermined time after the driver circuit provides the drive signal; and a controller to generate an error signal when the sampled output indicates that the capacitive load having the relatively high capacitance value is actually connected to the output terminal.

22. A method, comprising:

comparing an output signal of a driver circuit to a reference signal that corresponds to a signal that would be generated if a capacitive load having a relatively high capacitance value were connected to the output signal;

sampling a result of the comparison at a predetermined time after the output signal is asserted; and generating an error signal when the sampled result indicates that the capacitive load having the relatively high capacitance value is actually connected to the output signal.

* * * * *